(12) United States Patent
Yu

(10) Patent No.: US 7,458,040 B1
(45) Date of Patent: Nov. 25, 2008

(54) RESETTABLE MEMORY APPARATUSES AND DESIGN

(75) Inventor: Kang Yu, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 484 days.

(21) Appl. No.: 11/218,400

(22) Filed: Sep. 1, 2005

(51) Int. Cl.
*G06F 17/50* (2006.01)

(52) U.S. Cl. ............... 716/1; 716/2; 716/3; 365/51; 365/63

(58) Field of Classification Search ........... 716/1, 716/2, 3; 765/51, 63; 365/51, 63
See application file for complete search history.

(56) References Cited

U.S. PATENT DOCUMENTS

| | | | |
|---|---|---|---|
| 5,067,110 A | | 11/1991 | Runaldue |
| 5,285,420 A | * | 2/1994 | Shibue ................. 365/218 |
| 5,373,466 A | | 12/1994 | Landela et al. |
| 5,831,868 A | | 11/1998 | Beausang et al. |
| 5,903,466 A | | 5/1999 | Beausang et al. |
| 6,192,447 B1 | * | 2/2001 | Shand ................... 711/111 |
| 6,282,127 B1 | | 8/2001 | Pang et al. |
| 6,289,498 B1 | | 9/2001 | Dupenloup |
| 6,292,931 B1 | | 9/2001 | Dupenloup |
| 6,295,636 B1 | | 9/2001 | Dupenloup |
| 6,298,472 B1 | | 10/2001 | Phillips et al. |
| 6,378,123 B1 | | 4/2002 | Dupenloup |
| 6,421,818 B1 | | 7/2002 | Dupenloup et al. |
| 6,442,721 B2 | | 8/2002 | Whetsel |
| 6,463,560 B1 | | 10/2002 | Bhawmik et al. |
| 6,539,523 B1 | | 3/2003 | Narain et al. |
| 6,598,209 B1 | | 7/2003 | Sokolov |
| 6,609,229 B1 | | 8/2003 | Ly et al. |
| 6,731,106 B2 | | 5/2004 | Whetsel |
| 6,772,277 B2 | * | 8/2004 | Naffziger ............... 711/104 |
| 6,836,420 B1 | * | 12/2004 | Seshadri et al. ........... 365/51 |
| 6,934,183 B1 | | 8/2005 | Seshadri et al. |
| 7,200,743 B1 | * | 4/2007 | Malpass ................ 713/1 |

FOREIGN PATENT DOCUMENTS

JP      408153126 A    6/1996

* cited by examiner

*Primary Examiner*—Stacy A Whitmore
*Assistant Examiner*—Magid Y Dimyan
(74) *Attorney, Agent, or Firm*—Blakely, Sokoloff, Taylor & Zafman LLP

(57) ABSTRACT

Resettable memory implemented using memory without reset and methods and apparatuses to design the same. A resettable memory may include: a plurality of resettable memory cells; a plurality of memory units; and a reset information propagation logic coupled to the resettable memory cells and the memory units. The reset information propagation logic is to write reset information into a portion of the memory units when one of the resettable memory cells has a reset value and one of the memory units is written into. Alternatively, a resettable memory may include: a memory unit; a resettable finite state machine to change state in response to write request to the memory unit; and a selector coupled to the finite state machine and the memory unit to select one from a reset value and an output from the memory unit based on at least a state of the finite state machine.

12 Claims, 16 Drawing Sheets

RESETTABLE MEMORY APPARATUSES AND DESIGN

TECHNOLOGY FIELD

At least some embodiments of the present invention relate generally to electronic circuit design, and more specifically, to methods and apparatuses for resettable memory and its design.

BACKGROUND

A typical memory unit may be viewed as having a plurality of storage cells (or simply, "cells"). The memory unit may be randomly accessed according to address signals. In the randomly accessible memory unit, associated with each cell is a unique address that identifies the location of a particular storage cell. Each storage cell can have the capacity to store "n" bits (where n is an integer greater than or equal to one). The n bits may be collectively referred to as a word of data.

Often, a memory unit is written to by: 1) providing a word of data to be written into the memory unit on a data bus; 2) providing an address that defines which storage cell will store the word of data; and 3) presenting a signal to the memory unit that effectively indicates the word of data on the data bus is to be written into the memory unit, such as a write enable (WE) control signal.

Often, a memory unit is read from by: 1) providing an address that defines which cell a word of data will be read from; and 2) presenting a signal to the memory unit that effectively indicates a word of data is to be read from the memory unit, such as a read enable (RE) control signal. The word of data retrieved from the memory unit is presented at the data output bus.

Alternatively, the cell identification in a write operation could be according to a time sequence based addressing, such as in a shift register. Or, it could be addressed using a mix of address and a time based sequence.

For example, some types of memory units are designed such that the memory cells are accessed according to predetermined sequences, such as a first-in first-out (FIFO) memory, a shift register look up table (SRL), etc. Words of data are written into the cells of such a memory unit in a predetermined fashion. The memory unit may be written to without supplied address. Data words are written into the corresponding memory cells based on the time sequence of write operations. The words of data may be read in a predetermined fashion, or be read randomly with a supplied address.

A commercial example that uses a mix of address and time based read/write is the Xilinx Virtex SRL primitive that is written into like a shift register and is read from like a RAM.

A memory unit may receive addresses for read and write from separate address buses or from the same address bus. A memory unit may receive data and output data on separate unidirectional buses, or on a bi-directional bus. In some embodiments, a single control line may be toggled between the read enable (RE) signal and the write enable (WE) signal, or be used to signal both the read and write operations when asserted (e.g., when the control signal line is having a particular value, such as one).

A memory unit can be used to implement a number of storage related devices such as a random access memory (RAM), a first-in-first-out (FIFO) queue (e.g., by appropriately controlling the address values of the memory unit such that a FIFO queue is emulated with the memory unit), a content addressable memory (CAM), a shift register, etc.

Some memory units as being offered to designers to implement their circuit designs, however, may not have a reset function. A reset function effectively "clears" the memory unit's cell word values to some "reset" value (e.g., an n-bit wide value of "0", or other predetermined values which may be dependent on the locations of the cells in a memory unit).

Often, the integration of circuitry for resetting the cell word values of the memory unit is too expensive and/or complicated to implement. For example, according to one approach, in order to implement a resettable memory, each n wide storage cell is implemented with resettable flip-flops that are individually accessed via complicated multiplexing and control circuitry. Here, the use of resettable flip-flops to implement each n wide storage cell (as well as the complicated multiplexing and control circuitry) can result in a resettable memory unit having noticeably slower performance (and that consumes more silicon surface area) than a memory unit that does not have resettable storage cells.

For the design of digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

SUMMARY OF THE DESCRIPTION

Resettable memory implemented using memory without reset and methods and apparatuses to design the same are described here. Some embodiments are summarized in this section.

In one aspect of the present invention, a memory apparatus, includes: a plurality of resettable memory cells (e.g., resettable in response to a single reset signal); a plurality of memory units; and a reset information propagation logic coupled to the resettable memory cells and the memory units, the reset information propagation logic to write reset information into a portion of the memory units in response to one of the resettable memory cells having a reset value (e.g., a value indicative of a status of being reset, and/or a predetermined value in response to a reset signal) when one of the memory units is written into.

In one example of an embodiment, when the one of the memory units is addressed for write, the reset information propagation logic is to write reset information (e.g., a value indicative of a status of being reset, and/or a predetermined value in accordance with a reset) into all of the memory units except the one of the memory units that is addressed for write, if the one of the resettable memory cells has a reset value. In one example, the portion of the memory units, into which the reset information propagation logic writes reset information, includes at least two of the memory units; and the reset information propagation logic writes reset information into the at least two of the memory units in parallel.

In one example of an embodiment, the reset information includes one or more signals of predetermined values written into more than one of the portion of the memory units. In one example, the reset information includes a one-bit indication of whether a corresponding memory location has received data written into a memory after a reset signal. In one example, the reset information includes a predetermined multi-bit reset value for a corresponding memory address.

In one example of an embodiment, one or more of the memory units have no reset capability; each of the resettable memory cells is resettable to one predetermined reset value in response to a reset signal; and a reset value in the one of the resettable memory cells is cleared, after reset information is written into the portion of the memory units in response to the one of the resettable memory cells having a reset value (e.g., in response to a write operation which affects one of the resettable memory cells having a reset value).

In one example of an embodiment, the memory apparatus further includes: a multiplexer coupled to the resettable memory cells and the memory units. When a memory location is accessed for read, i) if one of the resettable memory cells that is in control of the memory location has a reset value, the multiplexer is to output a reset value (predetermined); and ii) if one of the resettable memory cells that is in control of the memory address does not have a reset value, the multiplexer is to output a value retrieved from one of the memory units according to the memory location.

In one example of an embodiment, the memory apparatus further includes: a plurality of memory address lines coupled to the resettable memory cells and the memory units. A first portion of the memory address lines is to select an output from a selected one of the resettable memory cells and to address one addressed memory location in each of the memory units; and a second portion of the memory address lines is to determine one of the memory units. In one example, to read from a memory address supplied on the address lines (e.g., read address lines), i) if the output from the selected one of the resettable memory cells has a reset value, the memory apparatus outputs a reset value; and ii) if the output from the selected one of the resettable memory cells does not have a reset value, the memory apparatus outputs a value from one of the memory units according to the second portion of the memory address lines.

In one example of an embodiment, to write into the memory address, if the output from the selected one of the resettable memory cells has a reset value: the selected one of the resettable memory cells is cleared off the reset value; and a reset value is written into the addressed memory location in each of the memory units, except the one of the memory units determined according to the second portion of the memory address lines (e.g., write address lines). In one example, the memory units has no reset capability.

In another aspect of the present invention, a memory apparatus, includes: a memory unit to store data in memory locations in the memory unit according to a predetermined sequence; a resettable finite state machine to change state in response to write request to the memory unit before a number of memory locations in the memory unit are written into after a reset, the finite state machine having less memory cells than the number of memory locations in the memory unit; and a selector coupled to the finite state machine and the memory unit, the selector to select one from a reset value and an output from the number of memory locations of the memory unit based on at least a state of the finite state machine. In one embodiment, the finite state machine counts how many memory locations have been written into after a reset.

In one example of an embodiment, the finite state machine includes a resettable counter having a count value; and the counter changes the counter value in response to write into the memory unit after a reset and before the number of memory locations in the memory unit are written into. In one embodiment, the finite state machine stops counting when all of the memory locations have been written into (e.g., the counter is stopped when the count value is equal to the total number of memory locations). In one example, before the counter value reaches a threshold, the selector selects the reset value; and after the counter value reaches the threshold, the selector selects the output from the memory unit.

In one example of an embodiment, the memory unit is randomly addressable through a plurality of address lines for read; the memory apparatus further includes: a logic coupled to the finite state machine and the address lines, based on a state of the finite state machine the logic to determine whether input data to the memory apparatus has been written into a memory location at an address supplied on the address lines since a reset of the finite state machine.

In one embodiment, the memory unit may include one of: a first-in first-out (FIFO) memory; and a shift register look up table (SRL).

In one example of an embodiment, the memory unit has not reset capability.

In one aspect of the present invention, a method to design a circuit, includes: identifying a representation of a resettable memory from a first design of the circuit; and implementing the resettable memory with a memory without reset according to embodiments of the present invention to generate a second design of the circuit. In one example, the first design is a behavioral level or a register transfer level design; and the second design is a gate level design. In one example, a circuit design is received in a Hardware Description Language (HDL).

The present invention includes processes implemented in circuit for resettable memories, methods and apparatuses which perform these circuit design methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
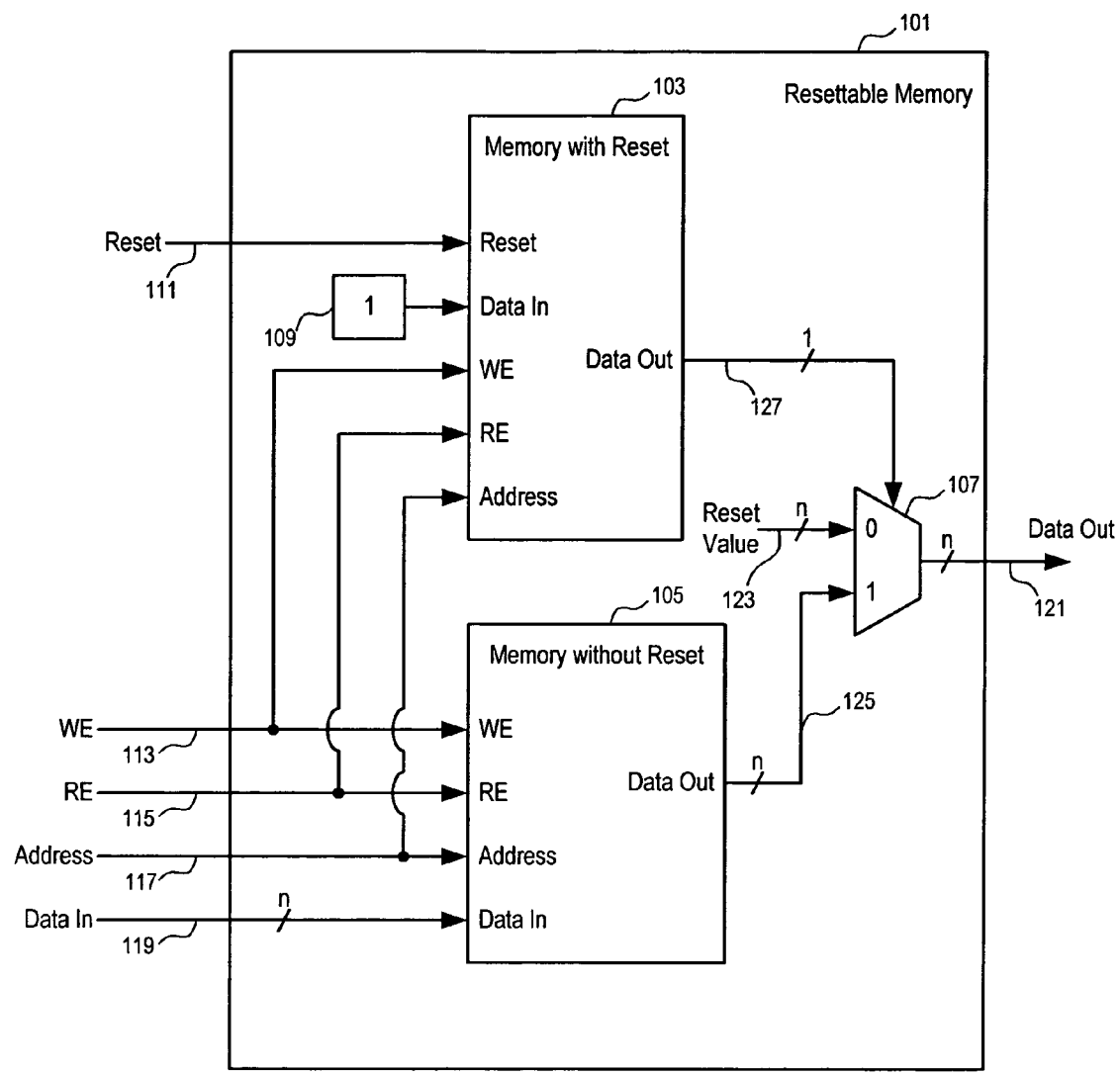
FIG. 1 illustrates a resettable memory implemented using a memory unit that does not have a reset capability.

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

U.S. Pat. No. 6,836,420 describes a resettable memory that includes a memory without reset capability having a data output coupled to a first input of a first multiplexer. A second input of the first multiplexer has a reset value input. A channel select for the first multiplexer is coupled to a resettable storage cell output that indicates whether a storage cell within the memory without reset capability has been written to after a reset or has not been written to after a reset.

In one embodiment, the resettable storage cells can be implemented as single-bit registers conceptually arranged as a flat one-dimensional array. Each of the registers corresponds to a different one of the storage cells of the memory without reset capability to indicate whether the corresponding cell of the memory without reset capability has been written to after a reset. For example, the single-bit registers can be mapped to flip-flops in FPGA.

However, as the number of storage cells of the memory without reset increases, the solution of using the same number of flip-flops to store the information about whether the cells have been written to since a reset does not scale very well. For example, when the number of flip-flops required exceeds certain threshold, for instance 1024, the area cost of write address decoder and the multiplexer for read operation can be too huge for FPGA implementation. The high chip area cost translates to huge timing delay, as well as long run time for the mapper software that maps the circuit design into a technology dependent netlist.

Some embodiments of the present invention seek to use less number of resettable storage cells than the number of storage cells of the memory without reset.

In one embodiment of the present invention, when data is written into the memory according to a predetermined sequence (e.g., in a way like FIFO, or shift register), a finite state machine (e.g., implemented using a counter) is used to indicate whether the corresponding cell of the memory without reset capability has been written to after a reset. The finite state machine has less memory cells than the number of addressable memory locations in the memory. When the capacity of the memory is large, the finite state machine (e.g., implemented using a counter) can be implemented more efficiently than an array of memory cells, one for each memory location.

In one embodiment of the present invention, instead of a flat one-dimensional array of single-bit registers used to store the information about whether the cells of the memory without reset capability have been written to after a reset, a hierarchical of memory cells are used to implement the reset capability. In the hierarchical reset approach, the number of resettable storage cells (e.g., implemented as flip-flops in FPGA) is smaller than the number of different addresses applicable to the memory. Thus, the number of resettable storage cells used to implement the reset capability does not increase linearly as the number of storage cells of the memory without reset capability increases. In one embodiment of the present invention, a single resettable storage cell can be used to control a number of memory addresses.

In one embodiment of the present invention, the information of RAM reset status is organized into a top and bottom hierarchy. One reset status bit in the top hierarchy commands a group of status bits in the bottom hierarchy. In one embodiment, the reset status registers in the top hierarchy are resettable (e.g., implemented using a flip-flop in FPGA); and the status memory cells in the bottom hierarchy may not be resettable (e.g., implemented using the RAM embedded in a look up table primitive).

At the first sight, a hierarchical reset approach seems to use more memory cells than using a flat one-dimensional array of single-bit registers. However, since the status memory cells in the bottom hierarchy can be implemented using compact versions of memory primitive, the hierarchical reset approach can be more efficient in silicon area usage as the memory capacity of the implemented resettable memory device increases.

In one embodiment, the hierarchical reset arrangement according to one embodiment of the present invention can achieve up to 16 times area reduction, reduce critical path by up to 50%, and reduce the run time of mapper software by up to 80%.

Further detailed examples are provided below.

FIG. 1 illustrates a resettable memory implemented using a memory unit that does not have a reset capability. In FIG. 1, the resettable memory (101) is implemented using a memory without reset (105) and a memory with reset (103). The size of data word in each of the memory cells in the memory without reset (105) is n bits, where n is an integer greater than or equal to one; and the size of data word in each of the memory cells in the memory with reset (103) is less than n bits (e.g., 1 bit). The memory cell at each address in the memory without reset (105), addressable through the address bus (117), has a corresponding memory cell in the memory with reset (103) to indicate whether the memory cell at the address has been written into to store input data obtained from the data-in bus (119).

In FIG. 1, upon receiving a reset signal on the reset control line (111), the memory with reset (103) is reset to output a value of zero for each address given on the address bus (117) for read operations (e.g., when the read enable signal on the control line (115) is asserted), until a corresponding address is written into after the reset.

When the write enable signal on the control line (113) is asserted, the same address on the address bus (117) is used to write the input data as specified on the bus (119) into the memory without reset (105) and to write the value of one (109) into the memory with reset (103). The value of one written into the memory with reset (103) indicates that the corresponding memory cell of the memory without reset (105) has a valid data written into since the reset.

When the value of one is output (127) from the memory with reset (103) during a read operation, the multiplexer (107) selects the valid output (125) from the memory without reset (105); otherwise, the multiplexer (107) selects the reset value (123) as the output (121) of the resettable memory (101).

In FIG. 1, the reset value (123) can be a single address-independent value. Alternatively, the reset value (123) may be a function of the memory address as supplied on the address bus (117). For example, different memory locations may have different reset values when the reset signal is asserted.

Thus, in FIG. 1, after the reset signal is asserted on the control line (111), some of the memory cells of the memory without reset (103) may have invalid data before data obtained from the bus (119) is written into these cells. However, during the time period that these cells have invalid data, the memory with reset (103) outputs a single-bit reset value, which causes the multiplexer (107) to output an n-bit reset value as the output from the resettable memory (101). When valid data is written into the memory cells of the memory without reset (103), the memory without reset (103) is written into a single-bit non-reset value, so that when the memory without reset (105) outputs (125) valid data, the valid data is propagated to the output (121) of the resettable memory (101).

In one embodiment of the present invention, the memory with reset (103) is implemented using a hierarchy of memory cells to reduce the number of resettable memory cells required.

Figure 2:
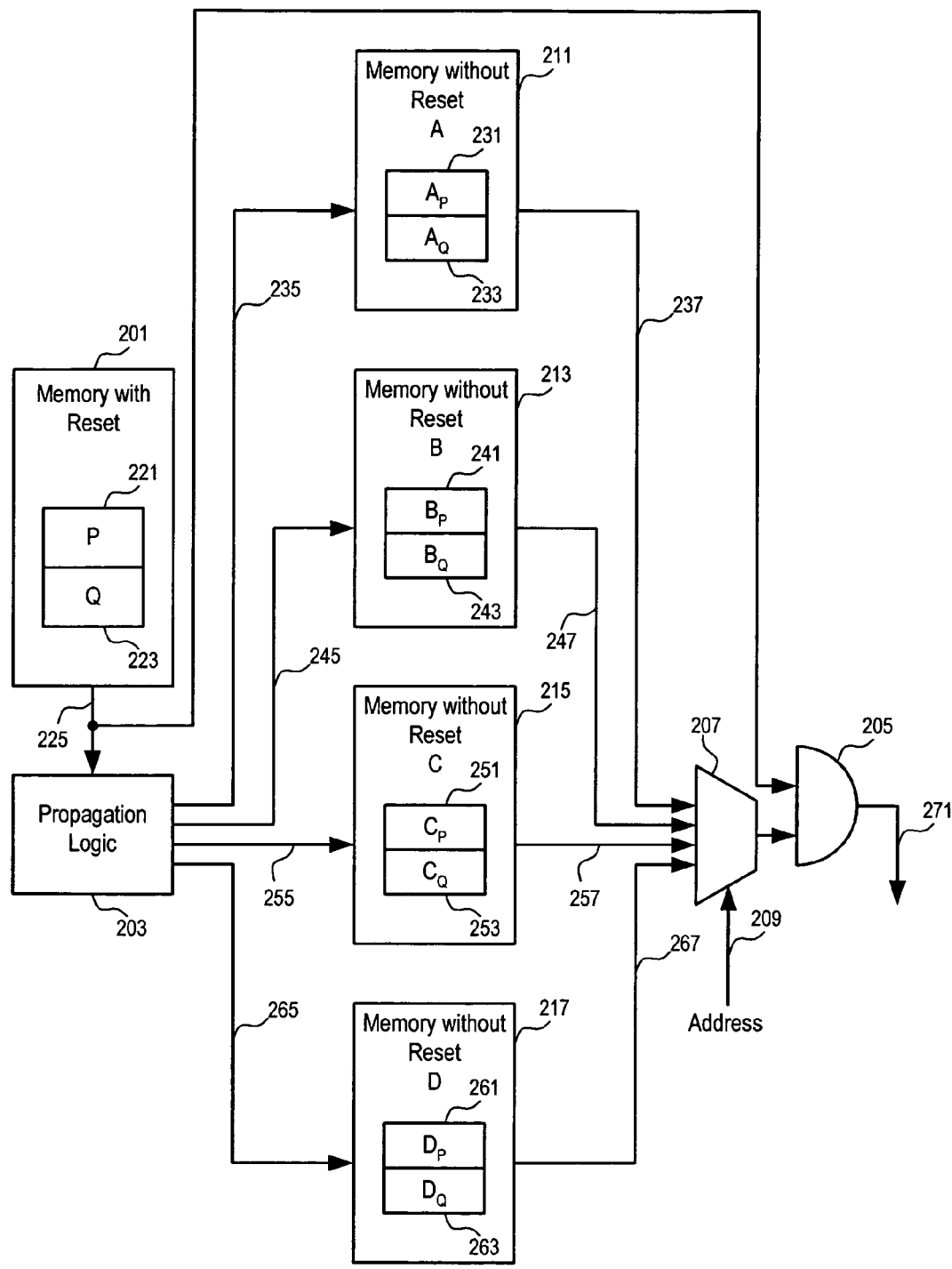
FIGS. 2-4 illustrate hierarchical reset memories according to embodiments of the present invention.

FIG. 2 illustrates a hierarchical reset memory (200) according to one embodiment of the present invention, which can be used as the memory with reset (103) of FIG. 1. In FIG. 2, the memory with reset (201) has less cells than the total number of bits used to individually indicate the reset status of each of the memory addresses that have been reset. A number of memories without reset (e.g., 211, 213, 215 and 217) are used, in combination with the memory with reset (201) to provide the number of bits used to individually indicate the reset status of each of the memory addresses that have been reset.

In FIG. 2, when the memory (200) receives a reset signal, the cells of the memory with reset (201) are set to the predetermined reset values (e.g., zero); and the cells of the memories without reset (e.g., 211, 213, 215, 217) generally have invalid data.

In FIG. 2, each cell of the memory with reset (201) is addressable by multiple addresses; and each cell of the collection of memories without reset (211, 213, 215 and 217) is addressable by one unique address.

When the memory (200) is read with a unique address for one of the cells of the collection of memories without reset (211, 213, 215 and 217), one of the cells of the memory with reset (201) is also read. This one of the cells of the memory with reset (201) is addressable by multiple addresses that uniquely identify a subset of cells of the collection of memories without reset (211, 213, 215 and 217). This subset of cells of the collection of memories without reset (211, 213, 215 and 217) can be considered as under control of this one of the cells of the memory with reset (201).

An output (225) of a reset value from the memory with reset (201) indicates that this subset of cells of the collection of memories without reset (211, 213, 215 and 217) have invalid data. Thus, the output (225) of a reset value causes the gate (205) to output a reset value (e.g., zero) as the output (271) of the memory (200). Otherwise, the content of the cell of the collection of memories without reset (211, 213, 215 and 217) as identified by the read address propagates through the multiplexer (207) and gate (205) to the output (271) of the memory (200).

The propagation logic (203) is used to propagate (235, 245, 255, 265) the reset information as stored in the memory with reset (201) into the memories without reset (e.g., 211, 213, 215 and 217).

When the memory (200) is written into with an address, which uniquely identifies a cell of the collection of memories without reset (211, 213, 215, 217), a cell in the memory with reset (201) is also read according to the address. The subset of cells of the collection of memories without reset (211, 213, 215, 217) which are under the control of this cell in the memory with reset (201) are written into with valid data, either a reset value or a data value supplied from the write request. The cell of the collection of memories without reset (211, 213, 215, 217) that is uniquely identified by the write address is written into the data supplied by the write request; and each of the other cells of the subset is written into a reset value.

After the propagation, all the subset of cells under control of the cell in the memory with reset (201) identified by the address store valid data; and the cell in the memory with reset (201) identified by the address is cleared off the reset value to prevent further propagations from this cell, until after this cell is reset again.

For example, in FIG. 2, top level cell P (221) controls bottom level cells $A_P$ (231), $B_P$ (241), $C_P$ (251), and $D_P$ (261); and top level cell Q (223) controls bottom level cells $A_Q$ (233), $B_Q$ (243), $C_Q$ (253), and $D_Q$ (263). When cell Q (223) has a reset value and cell $B_Q$ (243) is address for write, the propagation logic propagates the reset value from cell Q (223) into cells $A_Q$ (233), $C_Q$ (253), and $D_Q$ (263). $B_Q$ (243) is written into the data supplied by the write request. Thus, after the propagation, cell Q (223) no longer has the reset value; and cells $A_Q$ (233), $B_Q$ (243), $C_Q$ (253), and $D_Q$ (263) have the valid data.

In one embodiment, a portion of the address bits are used to address the memory with reset (201) to generate an output (225); and the same address bits are used to address the memories without reset (211, 213, 215, 217) to generate outputs (237, 247, 257, 267) in parallel for read. Other address bits (209) are used in the multiplexer (209) to select one from the outputs (237, 247, 257, 267) of the memories without reset (211, 213, 215, 217). When the output (225) is a reset value (e.g., zero), the gate (205) outputs the reset value; otherwise, the gate (205) outputs the value selected by the multiplexer (209).

In one embodiment, the propagation logic propagates information to memories without reset (211, 213, 215, 217) in parallel during a write cycle. Alternatively, or in combination, the reset information can also be propagated during a read cycle.

In general, assume a RAM (e.g., memory 105) has D words. D single bit registers can be used to stored their status information related to reset (e.g., whether the corresponding word has valid data after the reset, or whether the corresponding address is to output a reset value). In one embodiment, integers M and N are chosen such that M×N>D. The top hierarchy contains M single bit resettable registers. Each of the resettable registers commands N registers in the bottom hierarchy.

In case of a reset operation, all the M bits in the top hierarchy are reset to zero; and the M×N bottom hierarchy memory cells will have invalid data in general.

In case of a write operation, the bottom hierarchy memory cell specified by write address is written into according to the write operation (e.g., to have a value of one to indicate a non-reset value for the corresponding memory cell of the memory without reset, or the input data of the write operation, etc.). Further, if the top hierarchy cell that commands this bottom hierarchy memory cell has a reset value (e.g., zero), the reset information is propagated into the other N-1 bottom hierarchy memory cells commanded by the top hierarchy cell (e.g., to store the value of zero to indicate a reset value for the corresponding memory cell of the memory with reset, or the reset values for the corresponding addresses, etc.). After the propagation, the top hierarchy cell that commands this bottom hierarchy memory cell is cleared off the reset value (e.g., to store a value of one). Thus, after one write operation to any bottom hierarchy memory cell commanded by the top hierarchy memory cell, all the bottom hierarchy memory cells commanded by this top hierarchy memory cell have valid data.

In case of a read operation, if the top hierarchy cell that commands the bottom hierarchy memory cell being read has a reset value, the output is a reset value; otherwise, the output is based on the output of the bottom hierarchy memory cell.

In one embodiment, the bottom hierarchy memory cells are used to store the information on whether or not the corresponding memory cell of the memory without reset; and the logical AND of the bottom hierarchy memory cell specified by read address and its commanding register in top hierarchy provides the reset status of the corresponding memory cell of the memory without reset.

Such a hierarchical reset circuit can be implemented efficiently (e.g., in FPGA or structured ASIC). For example, the top hierarchy can be mapped to M flip-flops; and the bottom hierarchy can be mapped to N RAMs, each having M memory cells. Each flip-flop in top hierarchy commands M memory cells evenly distributed among the N RAMs. For example, when D=8, the partition can be: M=2 and N=4. In general, M and N are determine to have values close to $D^{1/2}$. In one embodiment, the partition of M and N are determined to balance the signal propagation delays from the top hierarchy to the bottom hierarchy and the signal propagation delays from the bottom hierarchy to the output of the memory.

In one embodiment, M and N are chosen based on the selecting a minimum W such that $D<2^W (500<2^9)$ $M=2^{int(W/2)} (2^4=16)$ $N=2^{W-int(W/2)} (2^5=32)$ For example, when D is 500, W is 9 so that $500<2^9$; int(W/2) is 4; M is $2^4$=16; and N is $2^5$=32.

Figure 3:
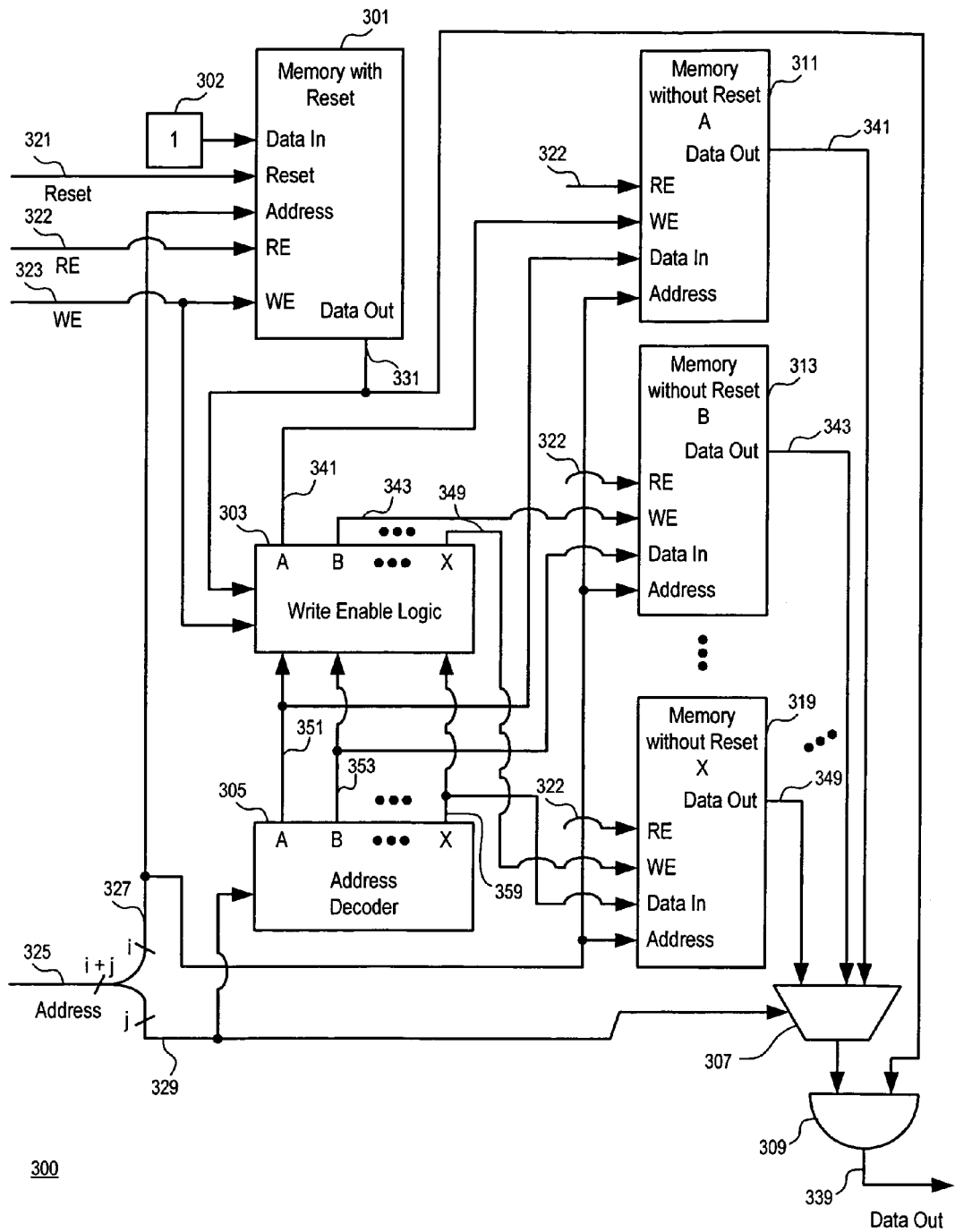

FIG. 3 shows a hierarchical reset memory (300) according to one embodiment of the present invention. The hierarchical reset memory (300) can be used to implement the memory with reset (103) with input (109) of FIG. 1.

In FIG. 3, the memory with reset (301) is used for top-level reset. Memories without reset (311, 313, ..., 319) are used to store at least one bit for each addressable memory address to be supplied on the address bus (325). When the reset signal is asserted on the control line (321), the memory with reset (301) is reset to output a reset value (e.g., zero) when addressed. When addressed to write, a non-reset value (e.g., one) (302) is written into the memory with reset; and if the corresponding cell had a reset value before the non-reset value is written into, reset information is propagated from the cell of the memory with reset (301) to the memories without reset (311, 313, ..., 319). After the reset information has been propagated from the memory with reset (301) to the memories without reset (311, 313, ..., 319), the cells of the memories without reset (311, 313, ..., 319) store the information on whether the corresponding memory address have been written into the data supplied from a data bus.

In FIG. 3, a portion of the address bits (327) (e.g., i of i+j bits) is used to address the cells of the memory with reset (301) and the corresponding cells of each of the memories without reset (311, 313, ..., 319). The other portion of address bits (329) (e.g., j of i+j bits) is used to determine which of the memories without reset (311, 313, ..., 319) is selected for the give address.

In FIG. 3, an address decoder (305) outputs signals (351, 353, ..., 359) for the corresponding memories without reset (311, 313, ..., 319). When a memory without reset is selected by the address, the address decoder (305) outputs a value of one for the corresponding memory. Thus, during a write operation, the memory without reset being selected by the address has a data-in of one (e.g., to indicate that the corresponding cell in the memory without reset is to be set to a non-reset value); and the memories not being selected by the address has a data-in of zero (e.g., to indicate that the corresponding cells in the memory is to be set to a reset value, if the reset value has not yet been propagated from the memory with reset (301)).

In FIG. 3, a write enable logic (303) combines the address information (e.g., output 351-359 based on the address bits 329), the output (331) of the memory with reset (301) and the write enable input (323) to generate write enable signals (341, 343, ..., 349) for the corresponding memories without reset (311, 313, ..., 319). When the write enable input (323) is not asserted, none of the write enable signals (341, 343, ..., 349) for the corresponding memories without reset (311, 313, ..., 319) is asserted. When the write enable input (323) is asserted, the write enable signal for the memory without reset being selected by the address is asserted to store a non-reset value in the corresponding cell. When the write enable input (323) is asserted, the write enable signals for memory without reset not being selected by the address are asserted to store a reset value in the corresponding cell only if the output (331) of the memory with reset (301) is a reset value.

In FIG. 3, when the read enable signal (322) is asserted, the address on the address bus (325) is used to read out the value stored in one of the memory cells of the memories without reset (311, 313, ..., 319). A portion of the address bits (327) is used to select one from each of the memories without reset (311, 313, ..., 319) to generate outputs (341, 343, ..., 349); and the multiplexer (307) is used to select one from outputs (341, 343, ..., 349) using the other portion of the address bits (329). Before the reset information in a cell of the memory with reset (301) is propagated into corresponding cells of the memories without reset (311, 313, ..., 319), the memory with reset (301) outputs a reset value (e.g., zero), which causes the gate (309) to output (339) a reset value (e.g., zero). After the reset information in a cell of the memory with reset (301) is propagated into corresponding cells of the memories without reset (311, 313, ..., 319), the memory with reset (301) outputs a non-reset value, which causes the gate (309) to output (339) a value based on the outputs (341, 343, ..., 349) of the memories without reset (311, 313, ..., 319).

The resettable memory (300) shown in FIG. 3 can be modified to allow the memories without reset to store reset values (e.g., address-dependent or address-independent), which may have a data word size larger than one bit. Further, the resettable memory can be modified to store the n-bit data input provided in a data bus. One example of such modifications is illustrated in FIG. 4.

Figure 4:
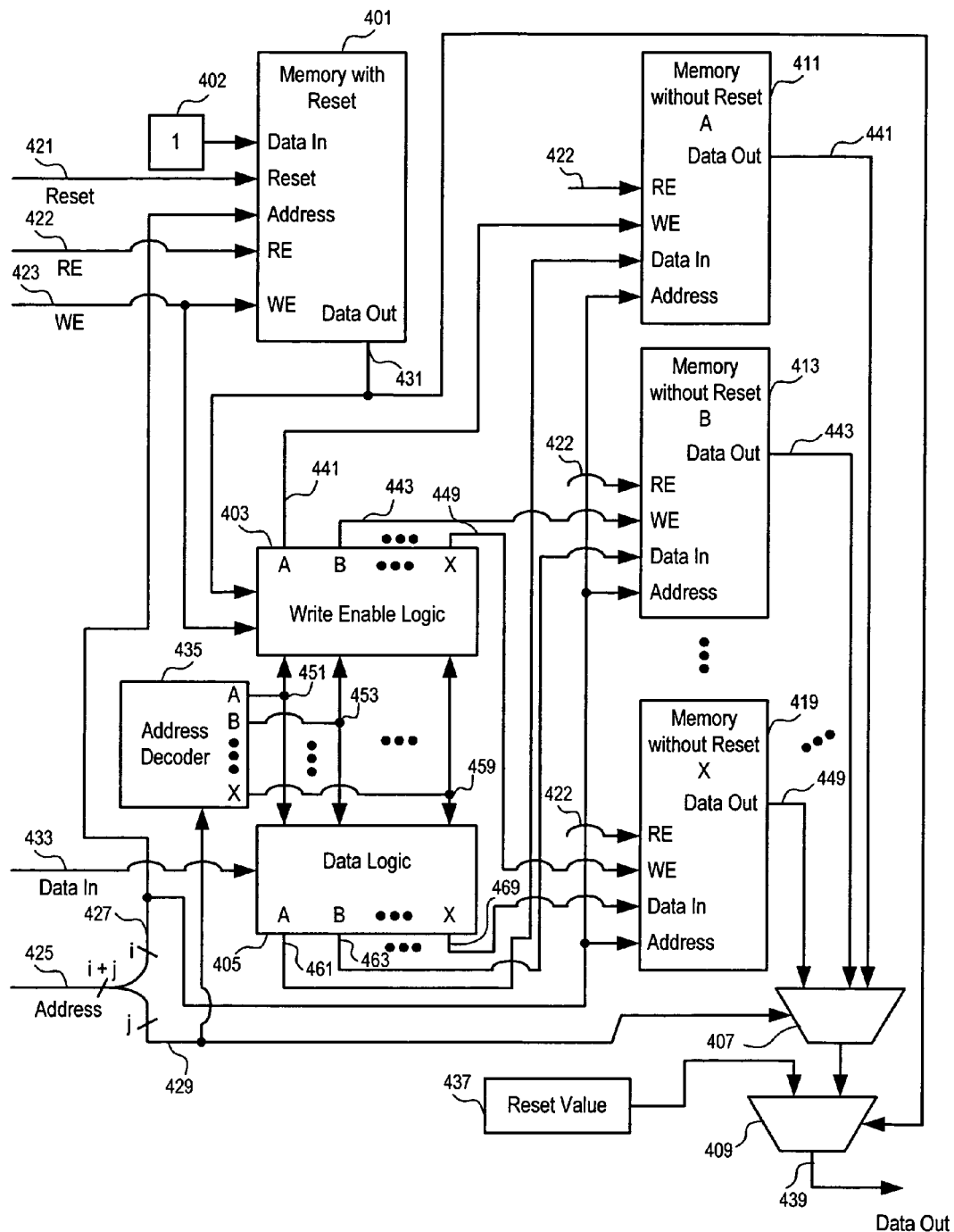

In FIG. 4, the memory with reset (401) has a reset input (421), which when asserted causes the memory with reset (401) to output a reset value until the reset information has been propagated to the memories without reset (411, 413, ..., 419). In FIG. 4, when the write enable input (423) is asserted, the non-reset value (402) is written into the memory with reset (401) according to a portion of the address bits (427).

When the write enable input (423) is asserted and the output (431) of the memory with reset (401) is a reset value, the write enable logic (403) propagates (441, 443, ..., 449) the write enable input also to the memories with reset that are not being selected by the address given on the address bus (425), in a way similar to that in FIG. 3, so that the reset values and the input data supplied on the bus (443) can be written into the memories without reset (411, 413, ... 419).

In FIG. 4, a data logic (405) is used to generate the data-in for the memories without reset (411, 413, ..., 419). Based on the outputs (451, 453, ..., 459) of the address decoder, the data logic (405) generates outputs (461, 463, ..., 469) for the corresponding data-in inputs of the corresponding memories without reset (411, 413, ..., 419). If the corresponding memory without reset is selected by the address according to the corresponding output of address decoder (435), the data logic (405) forwards the input data from the bus (433) to the data-in of the corresponding memory without reset; otherwise, the data logic (405) forwards (or generates) the corresponding reset value. In general, the reset value can be a function of the address of the corresponding cells of the memories without reset.

In FIG. 4, the output (431) of the memory with reset (401) is used to control the selection from a reset value (437) and the output of a multiplexer (407). The reset value (437) can be a function of the address on the address bus (425). When the read enable signal is asserted on the control line (422), a portion of the address bits (427) are used to select one from each of the memories without reset (411, 413, ..., 419) to generate outputs (441, 443, ..., 449). The other portion of the address bits (429) are used to select one from the outputs (441, 443, ..., 449) as the readout from the memories without reset (411, 413, ..., 419). When the output (431) of the memory with reset has a reset value (e.g., zero), the multiplexer (409) selects the reset value (437) for the output (439). When the output (431) of the memory with reset has a non-reset value (e.g., one), the multiplexer (409) selects the readout from the memories without reset (411, 413, ..., 419).

Figure 5:
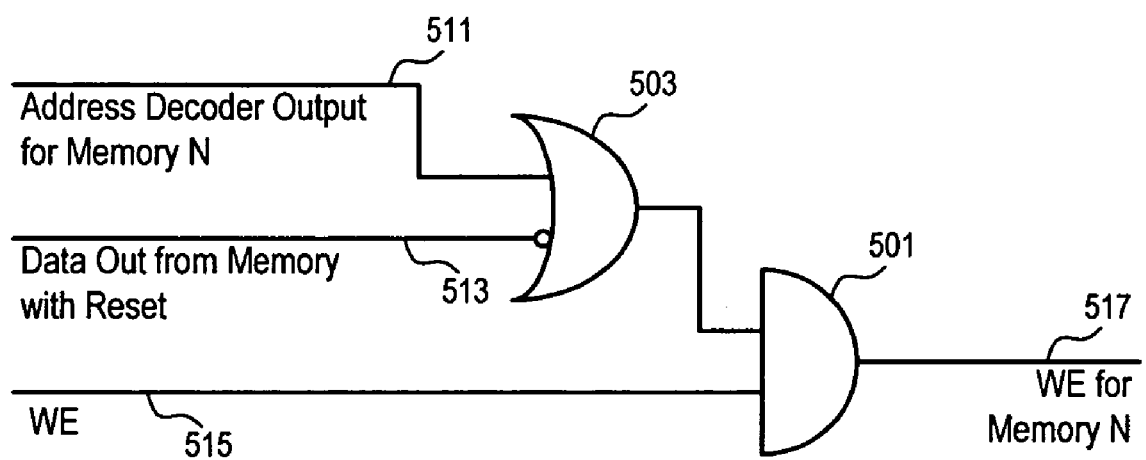
FIG. 5 illustrates a portion of a write enable logic which can be used in resettable memories according to embodiments of the present invention.

FIG. 5 illustrates a portion of a write enable logic which can be used in resettable memories according to embodiments of the present invention. The write enable logic can be used in examples of FIGS. 3 and 4.

In FIG. 5, the write enable input (515) is connected to an AND gate (501) so that the write enable for memory N can be asserted only if the write enable input (515) is asserted. An OR gate (503) is used to combine the data out (513) from memory with reset and the address decoder output (511) for memory N. When the data out (513) from memory with reset has a reset value (e.g., zero) or the address decoder output (511) for memory N is one to select memory N for writing, the OR gate (503) outputs one to forward the write enable for memory N (517); otherwise, the write enable for memory N is not asserted. Multiple ones of the unit as shown in FIG. 5 can be used to implement the write enable logic (303 or 403).

Figure 6:
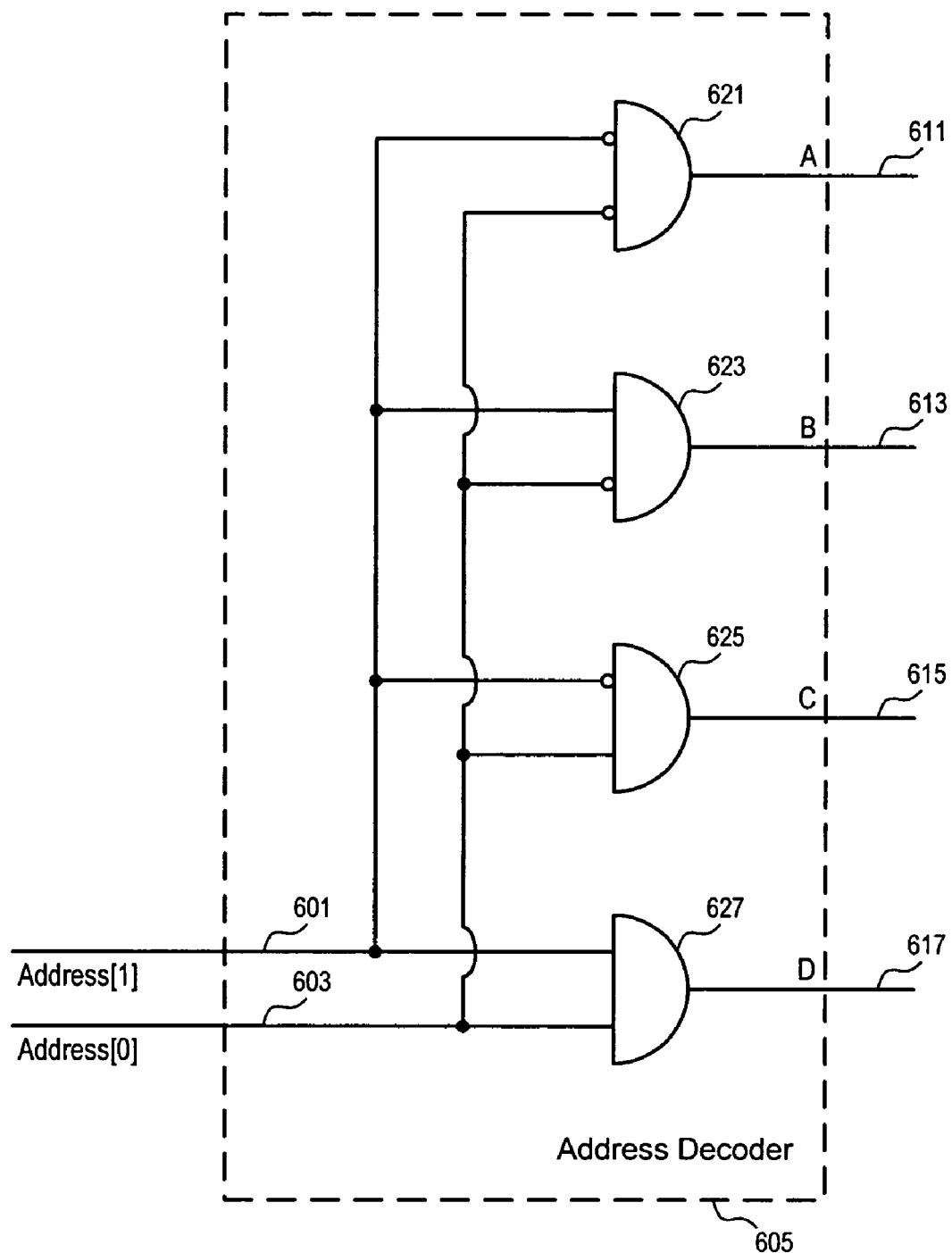
FIG. 6 illustrates an example of an address decode which can be used in resettable memories according to embodiments of the present invention.

FIG. 6 illustrates an example of an address decoder which can be used in resettable memories according to embodiments of the present invention. In FIG. 6, each of the output lines (611, 613, 615, 617) of the address decoder (605) corresponds to a unique address value represented by the address bits (601 and 603). When the unique address is presented, the corresponding output line is asserted (e.g., having a value of one) and the other lines are not asserted (e.g., having a value of zero). The gates (621, 623, 625, 627) combine the address bits (601 and 603) to generate the outputs.

Although FIG. 6 shows a decoder for a two-bit address, in general, an address decoder may decode an address with more or less address bits.

Figure 7:
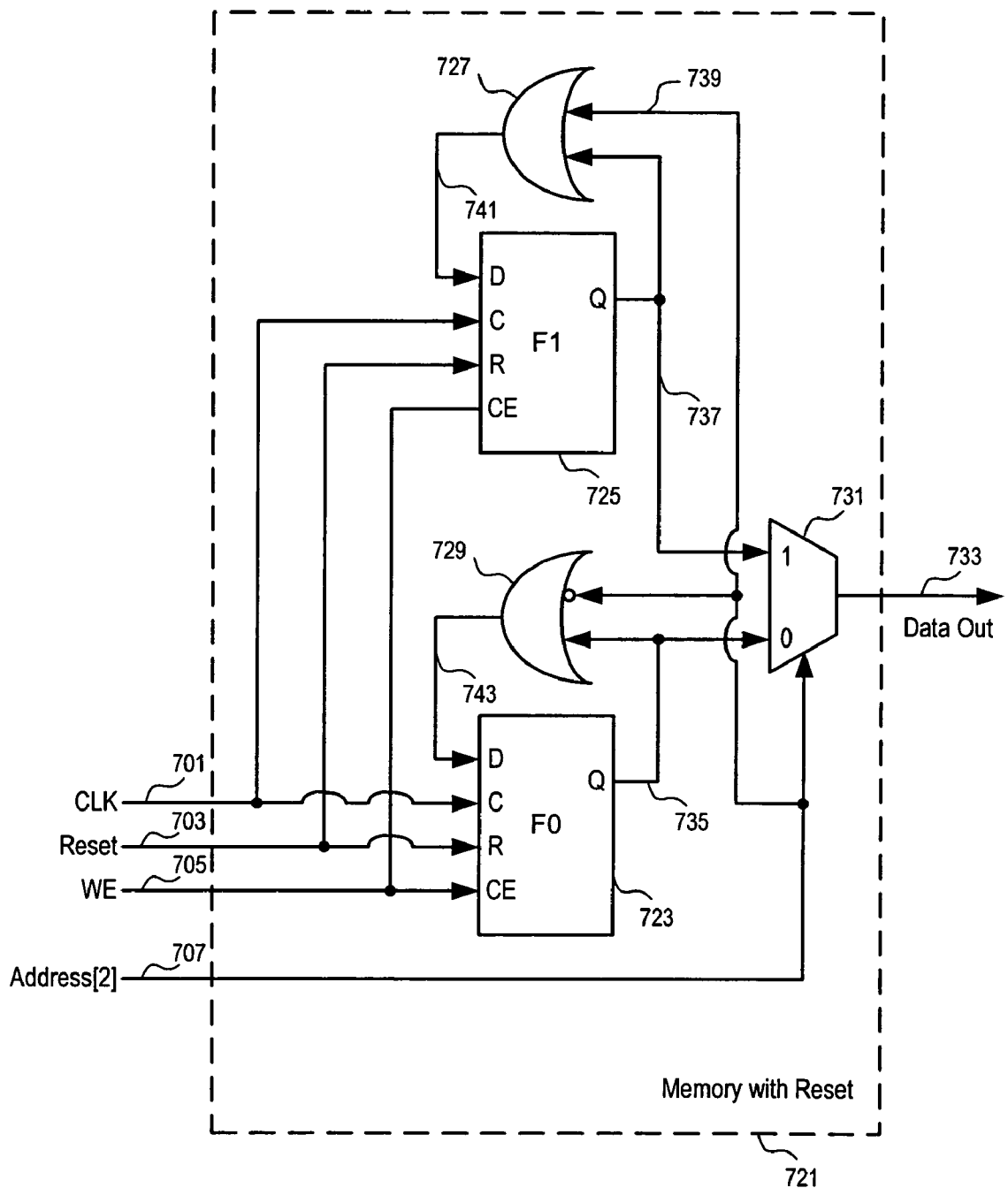
FIG. 7 illustrates an example of a memory with reset capability which can be used in resettable memories according to embodiments of the present invention.

FIG. 7 illustrates an example of a memory with reset capability which can be used in resettable memories according to embodiments of the present invention. In FIG. 7, the flip-flops (725 and 723) are used to implement resettable memory cells. Synchronized with a clock (701), the flip-flops reset to have a value of zero when the reset signal is asserted on the control line (703).

For an address given on the address line (707), the multiplexer (731) select the output from a corresponding one of the flip-flops (725 and 723) as the output (733) of the memory with reset (721). For example, when the address line (707) has a value of zero, the output (735) of the flip-flops (723) is selected; and when the address line (707) has a value of one, the output (737) of the flip-flops (725) is selected.

In FIG. 7, the OR gates (727 and 729) are used to provide inputs (741 and 743) to the flip-flops according to the address given on the address line (707), when the write enable (705) is asserted. When the flip-flop is selected by the address, the corresponding OR gate receive an input value of one based on the address; and the corresponding OR gate generate an input value of one, a non-reset value, for the corresponding flip-flop. Thus, when the write enable (705) is asserted, the flip-flop as selected by the address is written into a non-reset value. The feedback loop at the non-selected flip-flop, from the output to the input of the flip-flop through the corresponding OR gate, causes the non-selected flip-flop to maintain the same stored value. Thus, effectively, only the non-reset value is written into the flip-flop selected by the address.

Although FIG. 7 shows a memory with a one-bit address, in general, the memory can include more flip-flops to support multiple-bits addresses. When multiple-bits addresses are used, an address decoder similar to that shown in FIG. 6 can be used. Each output of the address decoder can be used to provide the other input to the OR gates on the feedback loop (e.g., to replace input 739 to the OR gate 727 using a corresponding output of the address decoder).

Figure 8:
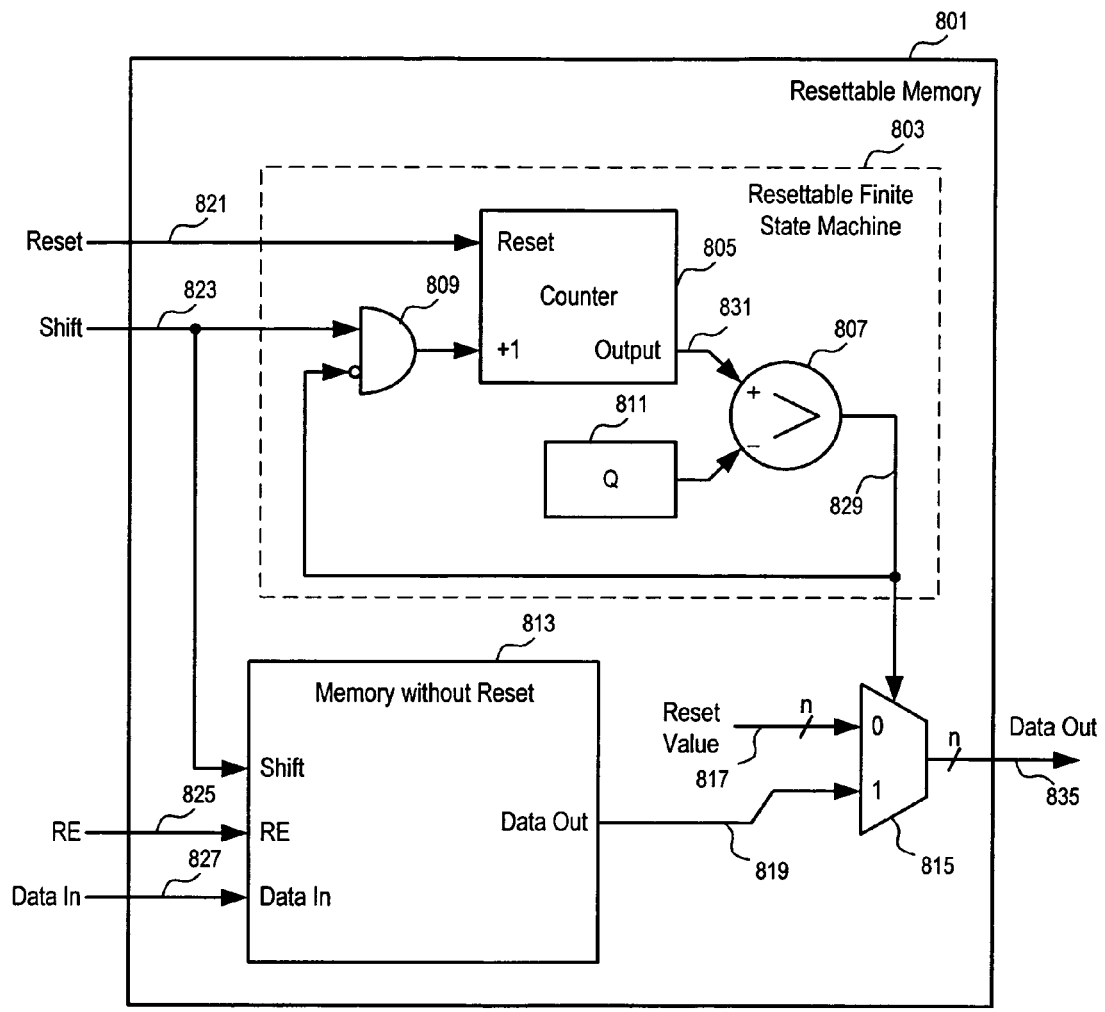
FIGS. 8-9 illustrate finite state machine based resettable memories according to embodiments of the present invention.
Figure 9:
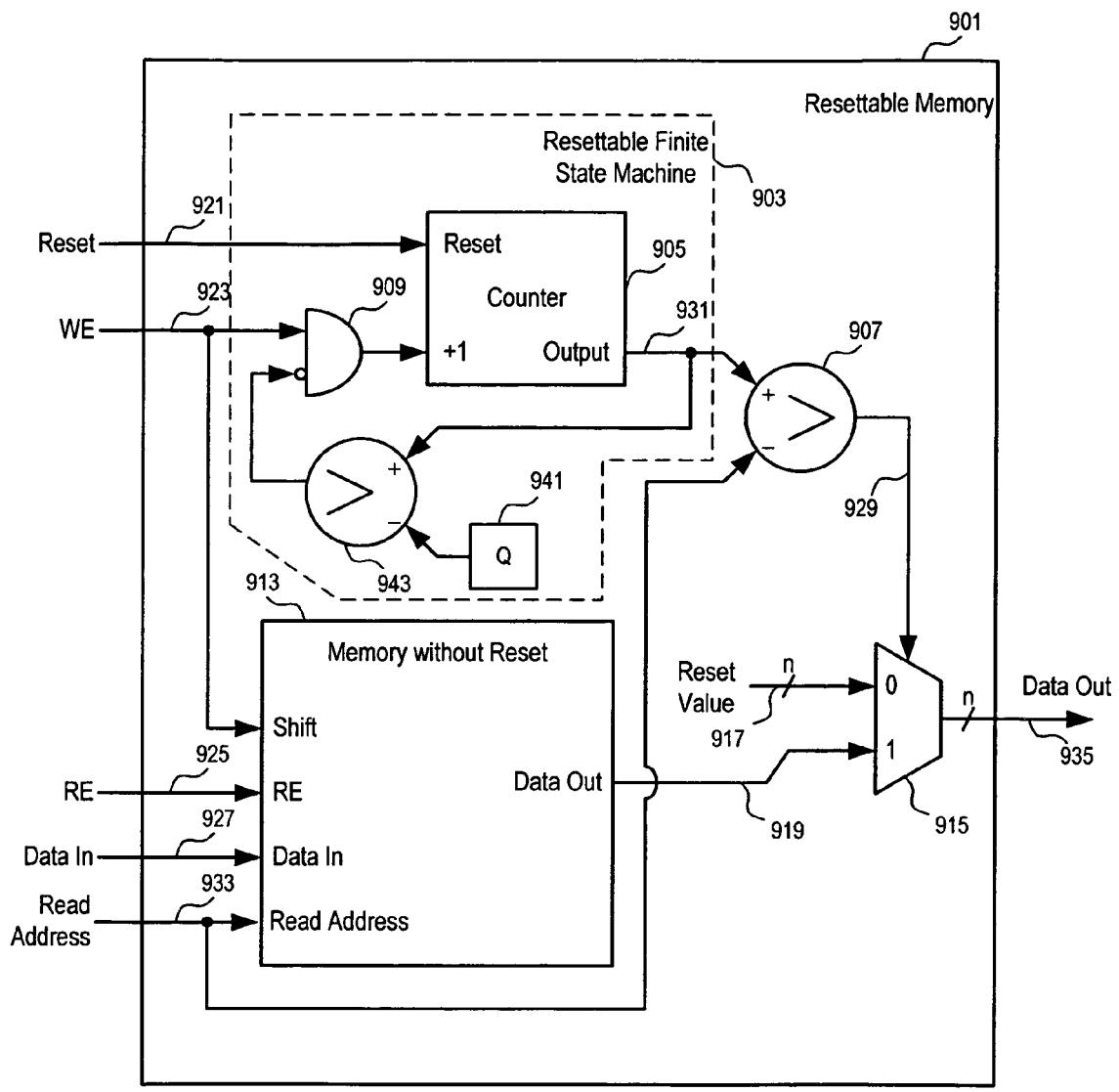

FIGS. 8-9 illustrate finite state machine based resettable memories according to embodiments of the present invention.

In FIG. 8, data is written into the resettable memory (801), and therefore memory without reset (813), in a predetermined sequence in response to a write request signal, such as a shift signal (or a write enable signal) on the control line (823). No address is provided for the write operation, since the data is written into the memory locations according to a predetermined sequence, such as FIFO or shifting down a string of registers.

In one embodiment of the present invention, to implement the resettable memory (801) using the memory without reset (813), a resettable finite state machine (803) is used to track the information about which memory location has been written into with valid data since the reset. The memory without reset (813) stores data supplied from the data-in bus (827) in response to the write control signal.

In FIG. 8, when the reset signal is asserted on the control line (821), the resettable finite state machine is reset to an initial state to indicate that the output (819) from the memory without reset (813) is not valid and that a reset value (817) is to be selected by the multiplexer (815) when the resettable memory (801) is read (e.g., in response to a read enable signal asserted on the control line (825)). When the resettable memory (801) is written into according to the write control signal (823), the resettable finite state machine (803) changes its state to indicate whether the data output (819) from the memory without reset (813) is valid or not. Since the data is written to the memory in a predetermined sequence and the state of the finite state machines changes also in a predetermined sequence, the state of the finite state machine can be used to identify the progress of writing in the memory.

In one embodiment, the resettable finite state machine is implemented using a number of memory cells that are less than the number of memory locations that will be reset, although the resettable finite state machine can also be implemented with an array of resettable memory cells that has at least the same number of memory cells as the memory without reset.

For example, in FIG. 8, the resettable finite state machine (803) is implemented using a counter (805) which generally has less memory cells than the desired number of resettable memory locations. When the desired number of resettable memory locations is large, a counter implementation takes much less silicon area than an array of memory cells.

In FIG. 8, for example, the memory without reset (813) stores data according to the first-in-first-out sequence (e.g., implemented as an FIFO or a shift register). When the reset signal is asserted, the counter (805) has a value of zero. The number Q (811) is based on the depth of the queue in the memory without reset (813). The comparator (807) compares the output (831) of the counter to the number Q (811). If the output (831) is not larger than the number Q (811), the output (829) of the comparator (807) is zero, which causes the multiplexer to select the reset value (817); otherwise, the output (829) of the comparator (807) is one, which causes the multiplexer to select the output (819) of the memory without reset (813) as the output (835) of the resettable memory (801).

Thus, after a reset, before sufficient data has been written into the memory without reset (813), the counter has a value no larger than the number Q (811) such that a reset value (817) is selected as output (835) of the resettable memory (801). After the sufficient data has been written into the memory without reset (813), the counter has a value larger than the number Q (811) such that the output (813) of the memory without reset is selected as output (835) of the resettable memory (801).

In FIG. 8, the feedback from the output (829) of the comparator (807) to the gate (809) is to prevent overflow in the counter (805) after sufficient number of data has been written into the memory without reset (813) and when further data is fed into the memory.

Note that the reset value (817) can be a function of the memory locations after the reset. A logic function can be implemented to compute the reset value based on the output (831) of the counter (805).

Note that in certain embodiments, the resettable memory may not have a separate read enable input. For example, the data may be read when the shift signal is asserted. In certain embodiments, the resettable memory may further include an address input for read.

For example, in FIG. 9, the resettable memory (901) has a read address input (933), which allows the random access to the memory locations. In response to the reset signal (921) and write enable signal (923), the resettable finite state machine (903) works in a way similar to the resettable finite state machine (803) in FIG. 8. The resettable finite state machine (903) may be implemented, for example, using a resettable counter (905) with a feedback loop to prevent overflow. The feedback loop may include the number Q (941), the comparator (943) and the gate (909).

In FIG. 9, data supplied on the data-in bus (927) is written into the memory without reset (913) according to a predetermined sequence (e.g., FIFO, shifting down, etc.).

When the read enable signal (925) is asserted, the read address (933) can be used to randomly address any of the memory locations in the memory without reset (913).

In FIG. 9, the comparator (907) compares the output (931) of the counter (905) and the read address (933) to determine whether the memory cell at the read address (933) in the memory without reset (913) has valid data after the reset. If the memory cell has valid data (e.g., as indicated by a counter value larger than the address), the output (929) of the comparator has a value of one such that the multiplexer (915) selects the output (919) from the memory without reset (913) as the output (935) of the resettable memory (901); otherwise, the reset value (917) is selected.

FIGS. 10-14 show processes in resettable memories according to embodiments of the present invention.

Figure 10:
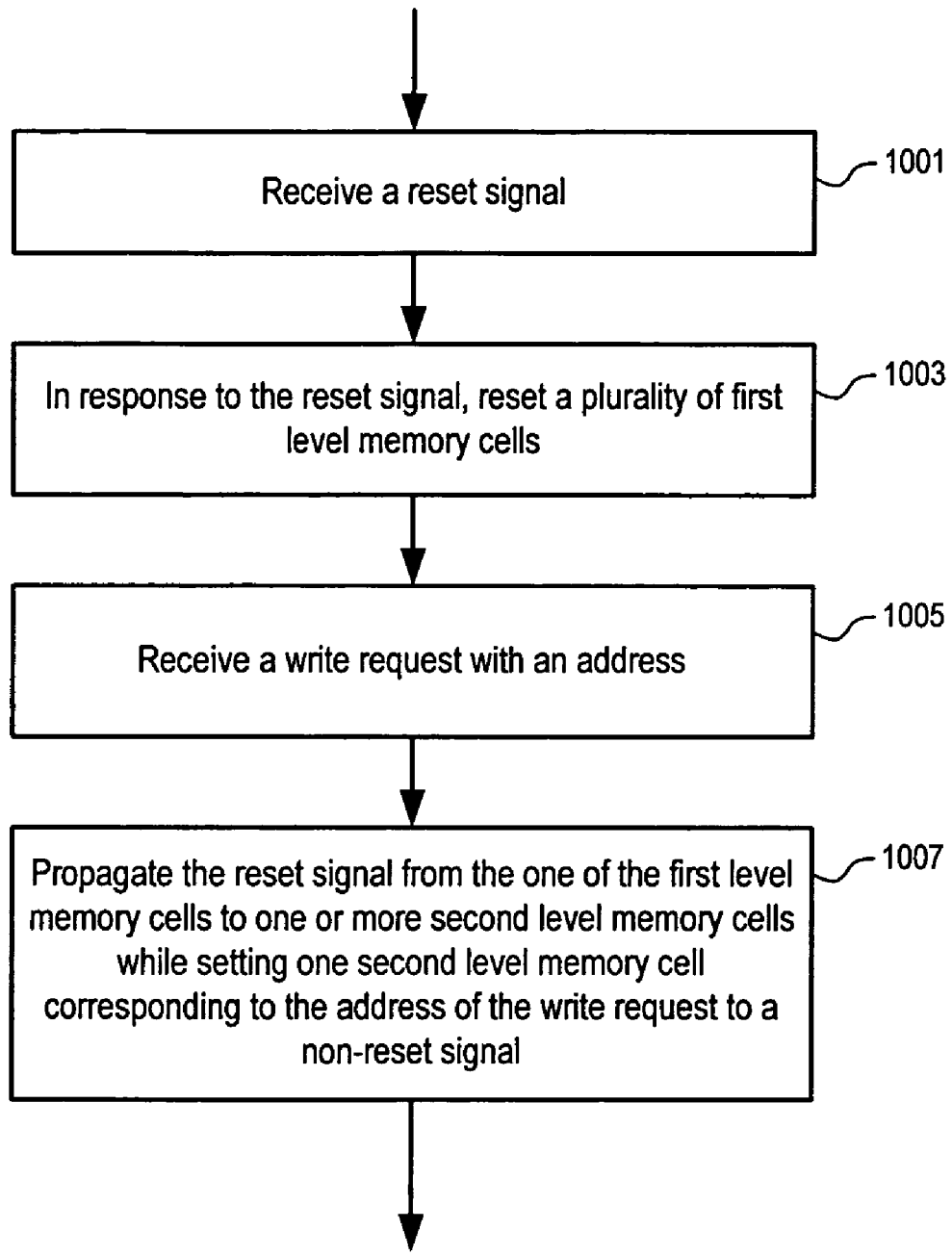
FIGS. 10-14 show processes in resettable memories according to embodiments of the present invention.

In FIG. 10, after operation 1001 receives a reset signal, operation 1003 resets a plurality of first level memory cells in response to the reset signal. When operation 1005 receives a write request with an address, operation 1007 propagates the reset signal from the one of the first level memory cells to one or more second level memory cells while setting one second level memory cell corresponding to the address of the write request to a non-reset signal. In one embodiment, after the propagation the corresponding one of the first level memory cells is cleared off the reset signal, such that a subsequent write to a memory address under control for the first level memory cells does not cause further propagation (until after a further reset signal for the first level memory cells is received).

Figure 11:
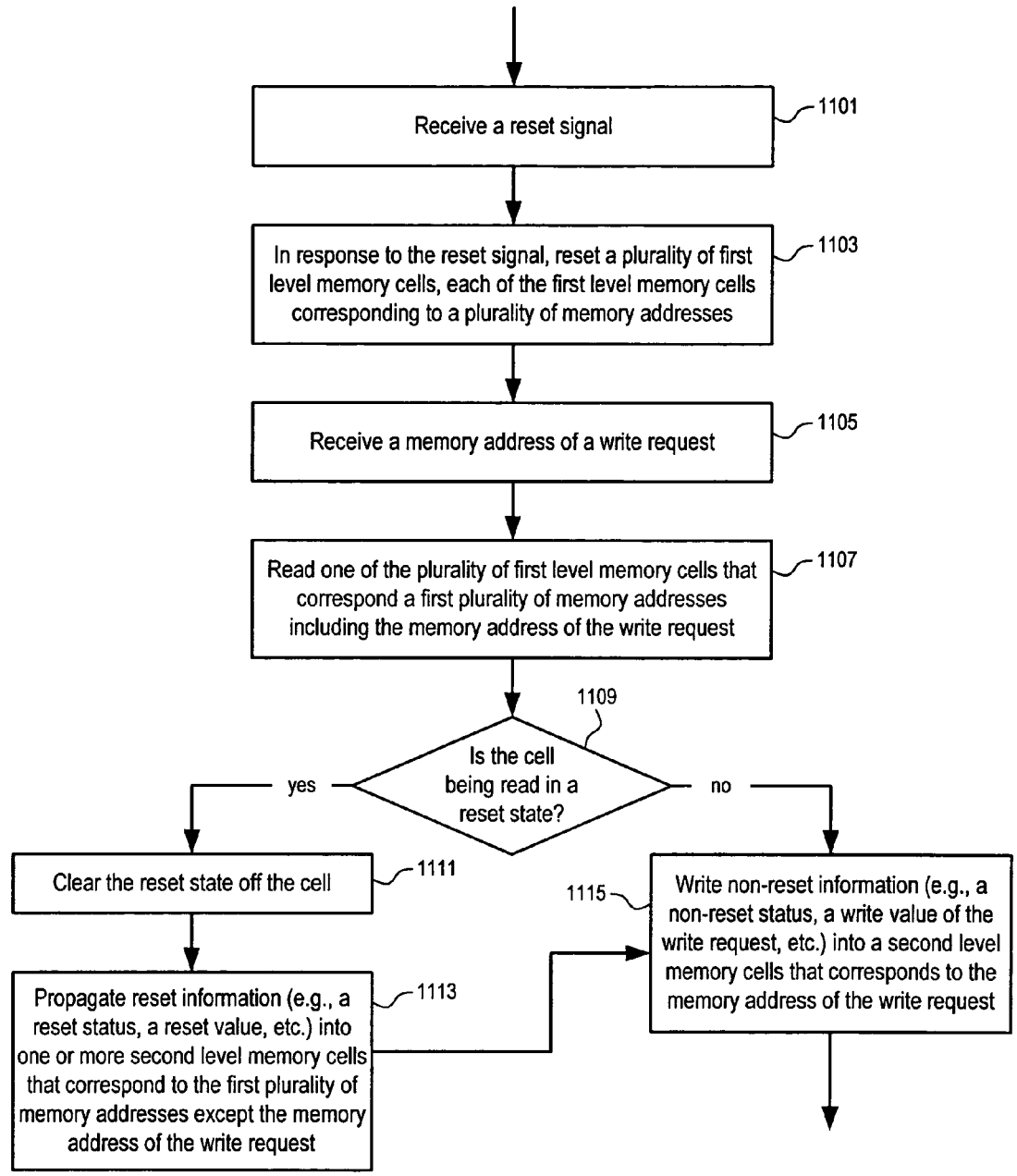

In FIG. 11, after operation 1101 receives a reset signal, operation 1103 resets a plurality of first level memory cells in response to the reset signal. Each of the first level memory cells corresponds to a plurality of memory addresses. After operation 1105 receives a memory address of a write request, operation 1107 reads one of the plurality of first level memory cells that correspond a first plurality of memory addresses including the memory address of the write request.

Operation 1109 determines whether the first level cell being read is in a reset state. If the cell is in a reset state, operation 1111 clears the reset state off the cell; operation 1113 propagates reset information (e.g., a reset status, a reset value, etc.) into one or more second level memory cells that correspond to the first plurality of memory addresses except the memory address of the write request; and operation 1115 writes non-reset information (e.g., a non-reset status, a write value of the write request, etc.) into a second level memory cells that corresponds to the memory address of the write request.

Note that in one embodiment, operations 1113 and 1115 are performed in parallel in different branches of the circuit, as illustrated in FIGS. 3 and 4.

In FIG. 11, if the cell is in a reset state, operation 1115 is performed.

Figure 12:
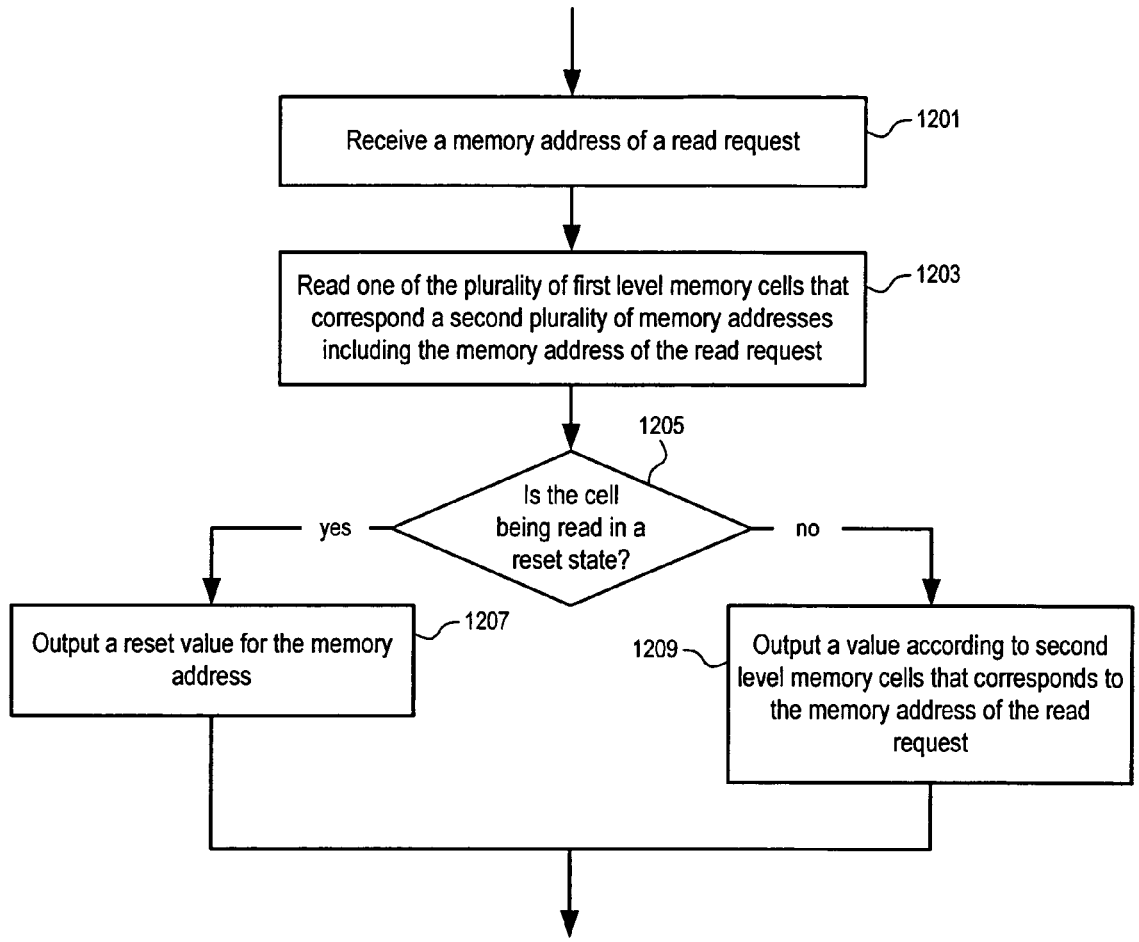

In FIG. 12, after operation 1201 receives a memory address of a read request, operation 1203 reads one of the plurality of first level memory cells that correspond a second plurality of memory addresses including the memory address of the read request.

Operation 1205 determines whether the first level cell being read is in a reset state. If the cell is in a reset state, operation 1207 outputs a reset value for the memory address (as a response to the read request); otherwise, operation 1209 outputs a value (as a response to the read request) according to second level memory cells that corresponds to the memory address of the read request.

Figure 13:
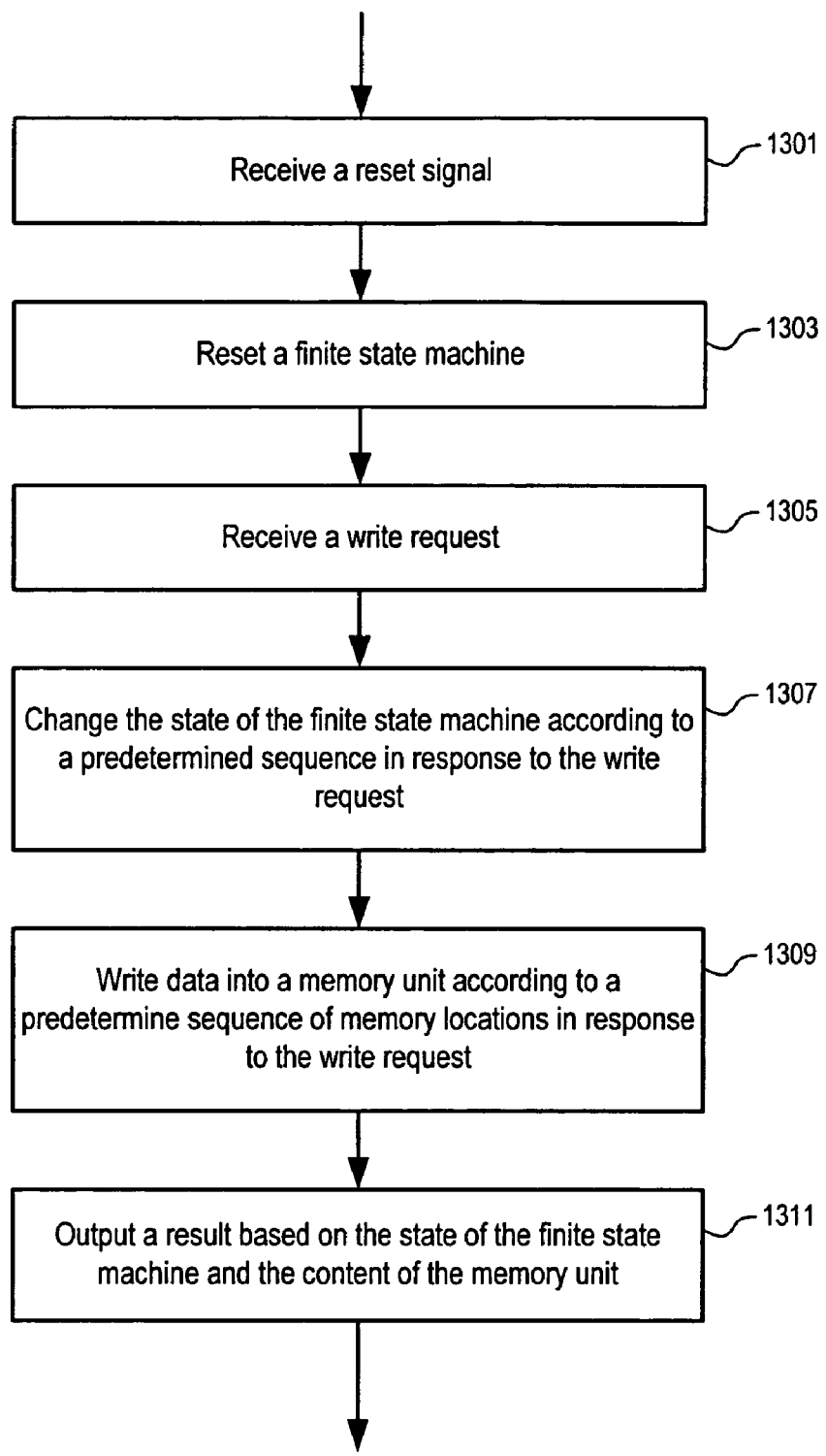

In FIG. 13, after operation 1301 receives a reset signal, operation 1303 resets a finite state machine. When operation 1305 receives a write request, operation 1307 changes the state of the finite state machine according to a predetermined sequence in response to the write request; and operation 1309 writes data into a memory unit according to a predetermine sequence of memory locations in response to the write request. Thus, the state of the finite state machine can be used to determine which memory location in the memory unit has valid data after the reset. Operation 1311 outputs a result based on the state of the finite state machine and the content of the memory unit (e.g., in response to a read request or in response to the write request).

Figure 14:
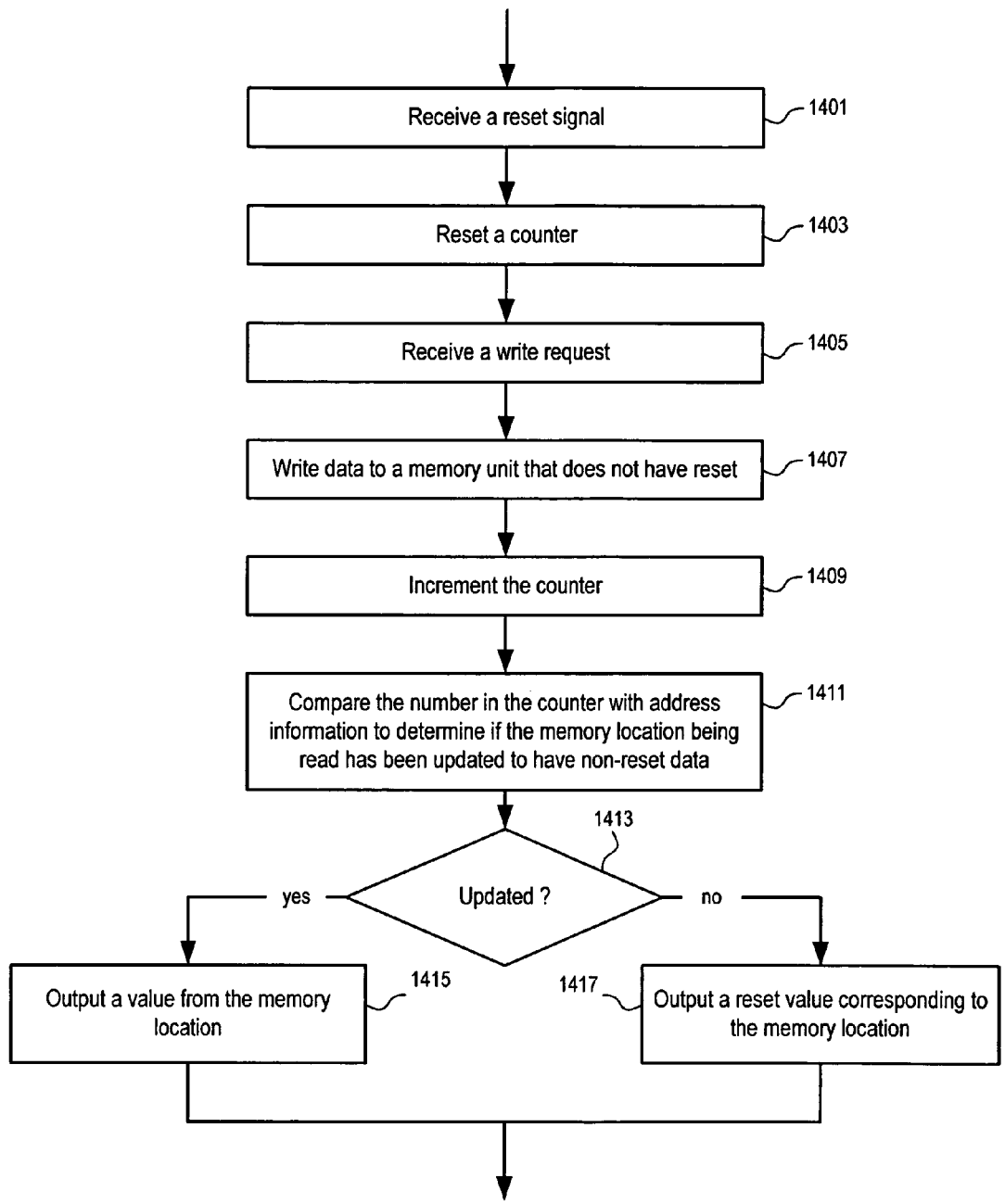

In FIG. 14, after operation 1401 receives a reset signal, operation 1403 resets a counter in response to the reset signal. When operation 1405 receives a write request, operation 1409 writes data to a memory unit that does not have reset; and operation 1407 increments the counter (e.g., before all memory locations of the memory unit that does not have reset haven been written into valid data).

Operation 1411 compares the number in the counter with address information to determine if the memory location being read has been updated to have non-reset data. Operation 1413 determines whether the memory location in the memory unit has been updated to have valid data after the reset. If the memory location has valid data, operation 1415 outputs a value from the memory location; otherwise, operation 1417 outputs a reset value corresponding to the memory location.

Figure 15:
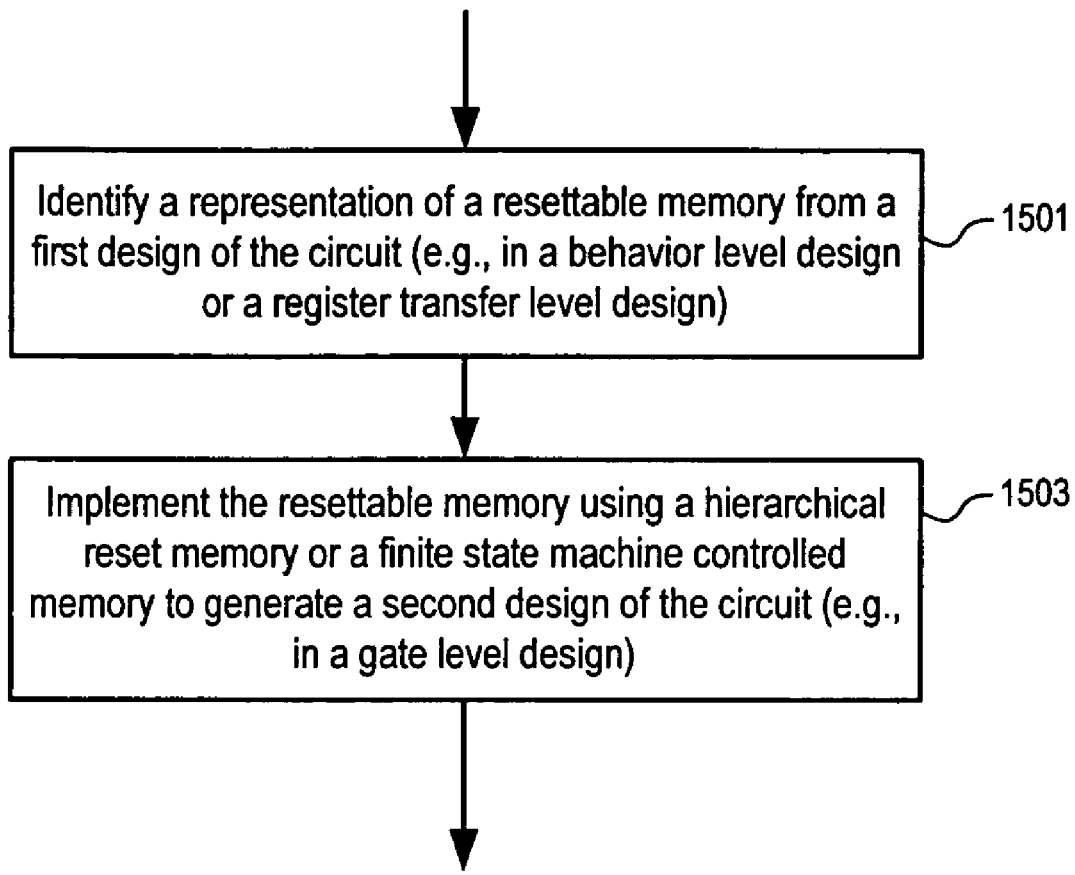
FIG. 15 illustrates a method to design a circuit according to one embodiment of the present invention.

FIG. 15 illustrates a method to design a circuit according to one embodiment of the present invention.

Operation 1501 identifies a representation of a resettable memory from a first design of the circuit (e.g., in a behavior level design or a register transfer level design). Operation 1503 implements the resettable memory using a hierarchical reset memory or a finite state machine controlled memory to generate a second design of the circuit (e.g., in a gate level design). For example, an HDL design of a circuit can be transformed into a design for implementation with FPGA or structured ASIC.

One embodiment of the present invention includes incorporating a memory having reset into a designer's circuit design, even if the underlying semiconductor technology does not easily provide for a memory core having selective reset. For example, semiconductor circuits are typically designed with a particular semiconductor manufacturing process (a "foundry") in mind. Usually, the foundry supplies models of basic building blocks (e.g., logic gates, memory units, etc.) from which a semiconductor chip design can be constructed.

The resettable memories discussed above may be used to effectively provide a designer with a resettable memory, even though the foundry only manufactures traditional memory units without reset or, offers resettable memories that are too cumbersome to implement as a large memory. For example, in one embodiment, a software design tool may be configured to offer the insertion of a resettable memory (such as that described above in FIGS. 3, 4, 8, 9, etc.) into a designer's design. If the designer decides to incorporate a resettable memory into his or her design, the resettable memory is automatically "built into" the designers design.

In one embodiment, the use of a resettable memory is automatically inferred from the behavioral level or RTL level description of the designer's design; and, in response, a resettable memory is automatically inserted into the circuit designer's design. A behavioral level or RTL level description is a circuit description that is tailored to be understood by a computer and that describes the circuit in terms of its methodology (e.g., the various processes performed by the circuit and the relationship(s) between them) as opposed to describing the circuit only in terms of its hardware components and the interconnections between them (e.g., gates, registers, signal lines, etc.).

Given that behavioral or RTL level descriptions are written in terms of methodologies to be understood by a computer, they are frequently documented in a form that is similar to a software program or a pseudo code description of the operational flow of the circuit. For example, a reset RAM similar to that shown on FIG. 1 can be described in an HDL as follows.

```
Module synReset(data_in, addr, reset, we, clk, data_out);
'include "ram_parms.v"
input [data_width-1:0] data_in;
input [addr_width-1:0] addr;
input reset, we, clk;
output [data_width-1:0] data_out;
integer i;
reg [data_width-1:0] mem[RAMsize-1:0];
wire [data_width-1:0] data_out;
always @ (posedge clk)
begin
if (reset == 1'-b1)
    for (i=0; i < RAMsize; i=i+1)
       mem[i] = reset_value;
else if (we == 1'b1)
    mem[addr] = data_in;
end
assign data_out = mem[addr]
endmodule
```

In order to automatically "install" a resettable memory into a circuit designer's design, a software design tool can be configured to automatically infer the use a resettable memory from a behavioral level or RTL level description by identifying from the operational flow of the circuit description that a reset condition is being individually applied to one or more variables (e.g., that is to be implemented in hardware as a data word that resides within some type of storage cell).

In response to the inferred use of a resettable memory, the software tool can be further designed to automatically install (or present the designer with an offer to automatically install) a resettable memory into the designer's circuit. In one embodiment, the resettable memory with a hierarchical reset or a finite state machine is incorporated into the designer's circuit at the gate level. Typically, an RTL level description of a circuit is compiled into a gate level netlist that describes the specific digital structures used in the design and the interconnections between them. Thus, upon recognition of a reset condition within the behavioral level or RTL level description of the circuit, the design tool can modify the design to incorporate the resettable memory at its corresponding gate level form.

In one embodiment, if the applicable foundry offers a memory unit with reset, the foundry offering can be incorporated as the memory unit with reset (e.g., 301) in the hierarchical reset memory. Further still, the design tool may be configured with its own design library that includes a memory with reset that can be configured from a foundry's standard logic offerings. As result, the resettable memory can be constructed even for those foundries that do not offer a memory with reset in their standard offerings.

Further details on automatic inference and implementation of memory with selective reset can be found in U.S. Pat. No. 6,836,420, which is hereby incorporated herein by reference.

Some of the methods of the present invention may be performed with a digital processing system, such as a conventional, general-purpose computer system. Special purpose computers, which are designed or programmed to perform only one function, may also be used.

Figure 16:
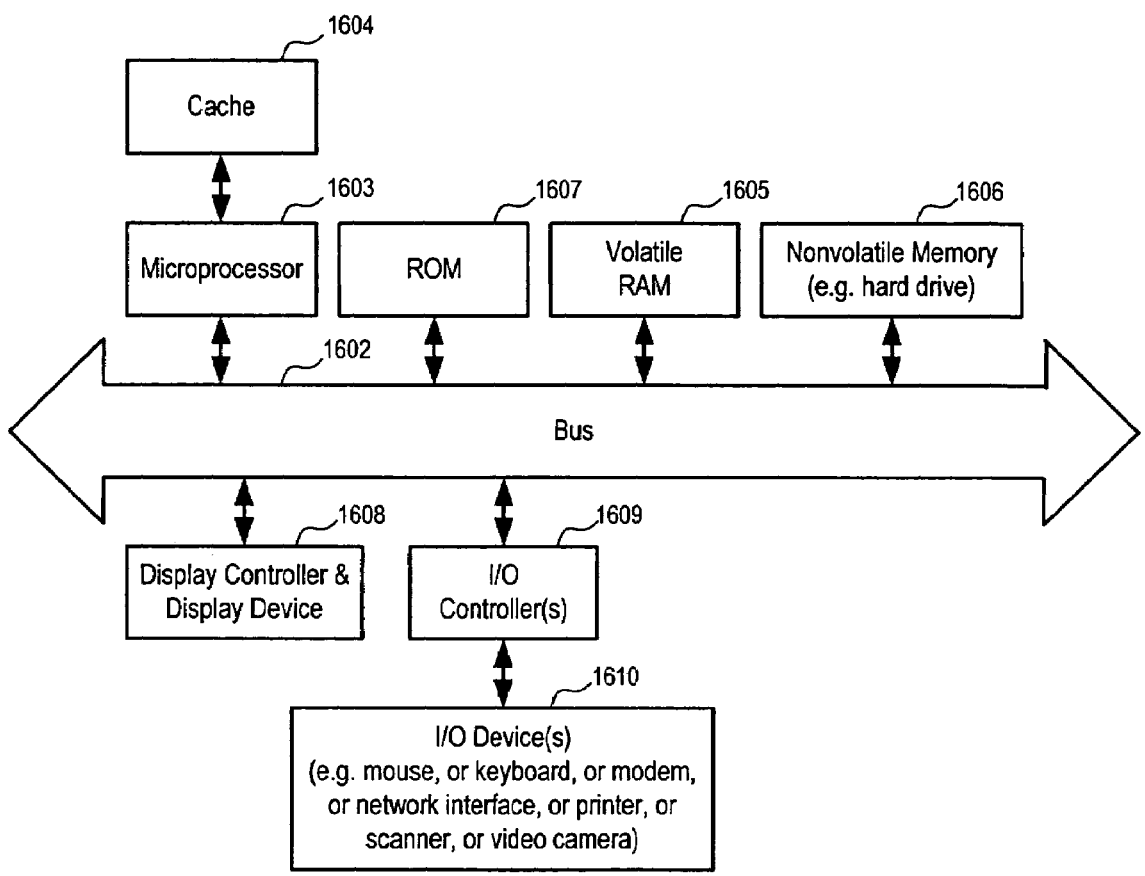
FIG. 16 shows a block diagram example of a data processing system which may be used with the present invention.

FIG. 16 shows one example of a typical computer system which may be used with the present invention. Note that while FIG. 16 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 16 may, for example, be a Sun workstation, or a personal computer (PC) running a Windows operating system, or an Apple Macintosh computer.

As shown in FIG. 16, the computer system 1601, which is a form of a data processing system, includes a bus 1602 which is coupled to a microprocessor 1603 and a ROM 1607 and volatile RAM 1605 and a non-volatile memory 1606. The microprocessor 1603 is coupled to cache memory 1604 as shown in the example of FIG. 16. The bus 1602 interconnects these various components together and also interconnects these components 1603, 1607, 1605, and 1606 to a display controller and display device 1608 and to peripheral devices such as input/output (I/O) devices which may be mice, keyboards, modems, network interfaces, printers, scanners, video cameras and other devices which are well known in the art. Typically, the input/output devices 1610 are coupled to the system through input/output controllers 1609. The volatile RAM 1605 is typically implemented as dynamic RAM (DRAM) which requires power continually in order to refresh or maintain the data in the memory. The non-volatile memory 1606 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 1602 may include one or more buses connected to each other through various bridges, controllers and/or adapters as is well known in the art. In one embodiment the I/O controller 1609 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 1607, volatile RAM 1605, non-volatile memory 1606, cache 1604 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 1603.

A machine readable medium can be used to store software and data which when executed by a data processing system causes the system to perform various methods of the present invention. This executable software and data may be stored in various places including for example ROM 1607, volatile RAM 1605, non-volatile memory 1606 and/or cache 1604 as shown in FIG. 16. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

While most embodiments of the present invention are intended for use in an HDL design synthesis software program, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTs) and associated logic of the integrated circuits which are field programmable gate arrays from Xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application-specific integrated circuits (ASICs).

Although some of the examples show receiving both read and write addresses from a same address bus, embodiments of the present invention can also be used in configurations where addresses for read and write are received from separate address buses.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to design a circuit, the method comprising:
    identifying a representation of a resettable memory from a first design of the circuit; and
    implementing the resettable memory to generate a second design of the circuit with a hierarchy of a first plurality of resettable memory cells and a second plurality of memory units coupled with a reset information propagation logic, the reset information propagation logic to write reset information into a third plurality of the memory units from one of the resettable memory cells having a reset value when one of the second plurality of the memory units is written into with a non-reset value.

2. The method of claim 1, wherein, when the one of the memory units is addressed for write, the reset information propagation logic is to write in parallel reset information into all of the memory units except the one of the memory units that is addressed for write, if the one of the resettable memory cells has a reset value.

3. The method of claim 1, wherein one or more of the memory units have no reset capability; each of the resettable memory cells is resettable to one predetermined reset value in response to a reset signal; and a reset value in one of the resettable memory cells is cleared, after reset information is written into the portion of the memory units in response to the one of the resettable memory cells having a reset value.

4. The method of claim 1, wherein the second design further includes a multiplexer coupled to the resettable memory cells and the memory units; when a memory location is addressed for read,
    if one of the resettable memory cells that is in control of the memory location has a reset value, the multiplexer is to output a predetermined reset value, and
    if one of the resettable memory cells that is in control of the memory address does not have a reset value, the multiplexer is to output a value retrieved from one of the memory units according to the memory location.

5. The method of claim 4, wherein the second design further includes:
    a plurality of memory address lines coupled to the resettable memory cells and the memory units, a first portion of the memory address lines to select an output from a selected one of the resettable memory cells and to address one addressed memory location in each of the memory units, and a second portion of the memory address lines to determine one of the memory units.

6. The method of claim 1, wherein the first design is a behavioral level or a register transfer level design; and the second design is a gate level design.

7. A machine readable storage medium containing executable computer program instructions which when executed by a digital processing system cause said system to perform a method to design a circuit, the method comprising:
    identifying a representation of a resettable memory from a first design of the circuit; and
    implementing the resettable memory to generate a second design of the circuit with a hierarchy of a first plurality of resettable memory cells and a second plurality of memory units coupled with a reset information propagation logic, the reset information propagation logic to write reset information into a third plurality of the memory units from one of the resettable memory cells having a reset value when one of the second plurality of the memory units is written into with a non-reset value.

8. The storage medium of claim 7, wherein, when the one of the memory units is addressed for write, the reset information propagation logic is to write in parallel reset information into all of the memory units except the one of the memory units that is addressed for write, if the one of the resettable memory cells has a reset value.

9. The medium of claim 7, wherein one or more of the memory units have no reset capability; each of the resettable memory cells is resettable to one predetermined reset value in response to a reset signal; and a reset value in one of the resettable memory cells is cleared, after reset information is written into the portion of the memory units in response to the one of the resettable memory cells having a reset value; and the second design further includes: a plurality of memory address lines coupled to the resettable memory cells and the memory units, a first portion of the memory address lines to select an output from a selected one of the resettable memory cells and to address one addressed memory location in each of the memory units, and a second portion of the memory address lines to determine one of the memory units.

10. A data processing system to design a circuit, the system comprising:
    means for identifying a representation of a resettable memory from a first design of the circuit; and
    means for implementing the resettable memory to generate a second design of the circuit with a hierarchy of a first plurality of resettable memory cells and a second plurality of memory units coupled with a reset information propagation logic, the reset information propagation logic to write reset information into a third plurality of the memory units from one of the resettable memory cells having a reset value when one of the second plurality of the memory units is written into.

11. A data processing system to design a circuit, the data processing system comprising:
    a memory to store a first design of a circuit;
    a processor coupled to the memory, the processor to identify a representation of a resettable memory from a first design of the circuit, and
    implementing the resettable memory to generate a second design of the circuit with a hierarchy of a first plurality of resettable memory cells and a second plurality of memory units coupled with a reset information propagation logic, the reset information propagation logic to write reset information into a third plurality of the memory units from one of the resettable memory cells having a reset value when one of the second plurality of the memory units is written into with a non-reset value.

12. The data processing system of claim 11, wherein, when the one of the memory units is addressed for write, the reset information propagation logic is to write in parallel reset information into all of the memory units except the one of the memory units that is addressed for write, if the one of the resettable memory cells has a reset value;
    wherein one or more of the memory units have no reset capability;
    wherein each of the resettable memory cells is resettable to one predetermined reset value in response to a reset signal; and
    wherein a reset value in the one of the resettable memory cells is cleared, after reset information is written into the portion of the memory units in response to the one of the resettable memory cells having a reset value.

* * * * *